United States Patent
Zhou et al.

(10) Patent No.: US 9,584,144 B1
(45) Date of Patent: Feb. 28, 2017

(54) ASYNCHRONOUS CLOCK GENERATION FOR TIME-INTERLEAVED SUCCESSIVE APPROXIMATION ANALOG TO DIGITAL CONVERTERS

(71) Applicant: Xilinx, Inc., San Jose, CA (US)

(72) Inventors: Lei Zhou, San Jose, CA (US); Hiva Hedayati, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/135,073

(22) Filed: Apr. 21, 2016

(51) Int. Cl.
- H03M 1/38 (2006.01)
- H03M 1/00 (2006.01)
- H03K 5/15 (2006.01)
- H03K 19/00 (2006.01)
- H03M 1/46 (2006.01)
- H03M 1/12 (2006.01)

(52) U.S. Cl.
CPC ........ H03M 1/002 (2013.01); H03K 5/15026 (2013.01); H03K 19/0013 (2013.01); H03M 1/121 (2013.01); H03M 1/46 (2013.01)

(58) Field of Classification Search
CPC .......... H03M 1/121; H03M 1/46; H03M 1/12; H03M 1/00; H03M 1/34; H03M 1/001; H03M 1/002; H03K 19/0013; H03K 5/15026
USPC .................. 341/155, 156, 110, 161
See application file for complete search history.

(56) References Cited

U.S. PATENT DOCUMENTS

| | | | |
|---|---|---|---|
| 7,626,438 B2 * | 12/2009 | Mari ......................... | G06F 1/08 327/298 |
| 7,646,185 B2 * | 1/2010 | Kim ....................... | H02M 3/157 323/222 |
| 7,834,793 B2 * | 11/2010 | Carreau ................ | H03M 1/462 341/155 |
| 2011/0002068 A1 * | 1/2011 | Hu .......................... | H02M 1/32 361/18 |
| 2013/0057424 A1 * | 3/2013 | Jeon ....................... | H03M 1/462 341/156 |
| 2014/0091960 A1 * | 4/2014 | Cowley ................... | H03M 1/12 341/172 |
| 2014/0184436 A1 * | 7/2014 | Lee ..................... | H03M 1/1009 341/161 |
| 2014/0210653 A1 * | 7/2014 | Harpe ..................... | H03M 1/02 341/110 |

(Continued)

OTHER PUBLICATIONS

Yang. J., et al., "A 1 GS/s 6 bit 6/ mW successive approximation ADC using asynchronous processing," IEEE Journal of Solid-State Circuits, Aug. 2010, pp. 1469-1478, vol. 45, No. 8, IEEE, Piscataway, New Jersey, USA.

*Primary Examiner* — Jean B Jeanglaude (74) *Attorney, Agent, or Firm* — Gerald Chan; LeRoy D. Maunu (57) ABSTRACT

A clock generator includes: a first input to receive a global clock signal; a second input to receive a completion signal; a third input to receive differential outputs in a conversion cycle from a comparator; and a logic circuit configured to generate a control clock signal based at least in part on the global clock signal and the differential outputs, and to provide the control clock signal to the comparator for a next conversion cycle; and wherein the logic circuit is also configured to disable the control clock signal in response to the completion signal indicating a completion of required conversion cycles in a conversion phase.

20 Claims, 10 Drawing Sheets

(56) References Cited

U.S. PATENT DOCUMENTS

2015/0029048 A1\* 1/2015 Jeon .................... H03M 1/1071
341/110

\* cited by examiner

ASYNCHRONOUS CLOCK GENERATION FOR TIME-INTERLEAVED SUCCESSIVE APPROXIMATION ANALOG TO DIGITAL CONVERTERS

TECHNICAL FIELD

An embodiment described herein relates generally to clock generators, and in particular, to asynchronous clock generators for analog-to-digital converters.

BACKGROUND

Analog-to-digital converters (ADCs) are used in electronic devices to translate analog signals for digital data processing. Specifically, ADCs convert an analog signal to a digital signal that is an approximation of the analog signal. Many types of ADCs have been developed to meet various performance, power, cost and size requirements. Recently, commercial devices are demanding higher speed and higher resolution. As a result, it is desirable to have ADCs with a higher sampling rate (e.g., giga-samples per second sampling rate).

ADCs may comprise comparators and clock generators. Comparators and clock generators for ADCs with a higher sampling rate consume more power because they are switching at a higher speed. Thus, power consumption caused by comparators and clock generators becomes a critical design consideration in the development of high-speed and power-efficient ADCs.

SUMMARY

A clock generator includes: a first input to receive a global clock signal; a second input to receive a completion signal; a third input to receive differential outputs in a conversion cycle from a comparator; and a logic circuit configured to generate a control clock signal based at least in part on the global clock signal and the differential outputs, and to provide the control clock signal to the comparator for a next conversion cycle; wherein the logic circuit is also configured to disable the control clock signal in response to the completion signal indicating a completion of required conversion cycles in a conversion phase.

Optionally, the clock generator is an asynchronous clock generator forming a part of, or coupling to, a successive-approximation-register analog-to-digital convertor (SAR ADC).

Optionally, the global clock signal is for controlling a conversion rate of the SAR ADC, wherein a first edge of the global clock signal is configured to trigger a sampling of an input signal, and a second edge of the global clock signal is configured to trigger a conversion of the sampled input signal to a corresponding digital output signal on a bit-by-bit basis.

Optionally, a first edge of the control clock signal is configured to trigger a comparison by the comparator and a second edge of the control clock signal is configured to trigger a resetting of the comparator.

Optionally, the clock generator further includes an OR gate, wherein the first input and the second input are inputs of the OR gate.

A successive-approximation-register analog-to-digital convertor (SAR ADC) includes the clock generator.

Optionally, the logic circuit comprises: a first transistor; a second transistor, wherein a drain of the first transistor is coupled to a drain of the second transistor; a third transistor configured to receive a first output of the differential outputs; and a fourth transistor configured to receive a second output of the differential outputs; wherein the third transistor and the fourth transistor are coupled between the first transistor and ground.

Optionally, the logic circuit further comprises a fifth transistor coupled to a source of the first transistor, and an OR gate coupled to a gate of the fifth transistor.

A method performed by a clock generator includes: receiving a global clock signal; receiving differential outputs from a comparator; generating a control clock signal for input to the comparator, wherein the control clock signal is generated by the clock generator based on the global clock signal and the differential outputs, and wherein the control clock signal is for controlling initiation of a next conversion cycle; and disabling the control clock signal in response to a completion signal indicating completion of required conversion cycles in a conversion phase.

Optionally, the method further includes: triggering a sampling of an input signal based on a first edge of the global clock signal; and triggering a conversion of the sampled input signal to a corresponding digital output signal on a bit-by-bit basis based on a second edge of the global clock signal.

Optionally, the clock generator is an asynchronous clock generator, which performs the acts of receiving the global clock signal and the differential outputs, the act of generating the control clock signal, and the act of disabling the control clock signal.

Optionally, the method further includes: triggering a comparison by the comparator based on a first edge of the control clock signal; and triggering a resetting of the comparator based on a second edge of the control clock signal.

An analog-to-digital convertor (ADC) includes: a comparator configured to provide differential outputs in a conversion cycle; a successive-approximation-register (SAR) configured to receive the differential outputs from the comparator, and to provide a N-bit binary output; and a clock generator having an input to receive the differential outputs from the comparator, the clock generator configured to generate a control clock signal for initiation of a next conversion cycle, wherein the clock generator is configured to disable the control clock signal in response to a completion signal indicating completion of N conversion cycles in a conversion phase.

Optionally, the ADC further includes a clock input to receive a global clock signal, wherein the global clock signal is configured for controlling a conversion rate of the ADC.

Optionally, a first edge of the global clock signal is configured to trigger a sampling of an input signal, and a second edge of the global clock signal is configured to trigger a conversion of the sampled input signal to a corresponding digital output signal on a bit-by-bit basis.

Optionally, the clock generator is configured to generate the control clock signal based on the global clock signal and the differential outputs from the comparator.

Optionally, the clock generator comprises an OR gate with a first input to receive the global clock signal and a second input to receive the completion signal.

Optionally, the control clock signal generated by the clock generator is an asynchronous clock signal.

Optionally, a first edge of the control clock signal is configured to trigger a comparison by the comparator, and a second edge of the control clock signal is configured to trigger a resetting of the comparator.

A time-interleaved SAR ADC architecture includes the ADC and additional ADCs, wherein the ADC is time-interleaving with the additional ADCs.

Other features, embodiments, and advantageous will be described in the detail description.

BRIEF DESCRIPTION OF THE DRAWINGS

The drawings illustrate the design and utility of some features, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings are not to be considered limiting in the scope of the claims.

FIG. 2-1 illustrates a high-speed time-interleaved SAR ADC architecture having multiple SAR ADCs.

FIG. 2-2 illustrates an example of one of the SAR ADCs in FIG. 2-1.

FIG. 3-1 is a circuit diagram illustrating an asynchronous clock generator.

FIG. 3-2 shows a SAR ADC having the asynchronous clock generator of FIG. 3-1.

FIG. 5-1 is a circuit diagram illustrating an asynchronous clock generator.

FIG. 5-2 shows a SAR ADC having the asynchronous clock generator of FIG. 5-1.

DETAILED DESCRIPTION

Various features are described hereinafter with reference to the figures. It should be noted that the figures are not drawn to scale and that the elements of similar structures or functions are represented by like reference numerals throughout the figures. It should be noted that the figures are only intended to facilitate the description. They are not intended as an exhaustive description of the claimed invention or as a limitation on the scope of the claimed invention. In addition, an illustrated item need not have all the aspects or advantages shown. An aspect or an advantage described in conjunction with a particular item is not necessarily limited to that item and can be practiced in any other items even if not so illustrated.

One type of analog-to digital converters (ADCs) is a successive-approximation-register (SAR) ADC that applies a binary search algorithm to analog-to-digital conversion. Specifically, within each conversion period, the SAR ADC samples an input voltage, compares it to a plurality of threshold voltages, and generates a corresponding digital output on a bit by bit basis. Since only a single comparator is used for each converter, SAR ADCs require relatively less power and smaller form factor. The resolution of SAR ADCs ranges from 8 to 16 bits with a sampling rate about several mega-samples per second (Msps). For achieving a higher sampling rate, a plurality of SAR ADCs may be employed to construct a time-interleaved SAR ADC. With this architecture, each of the SAR ADCs may take turns sampling input signals such that the time interval between subsequent sampling events is reduced. The outputs of each SAR ADC are interleaved to generate the digital output signal for further digital processing.

Figure 1:
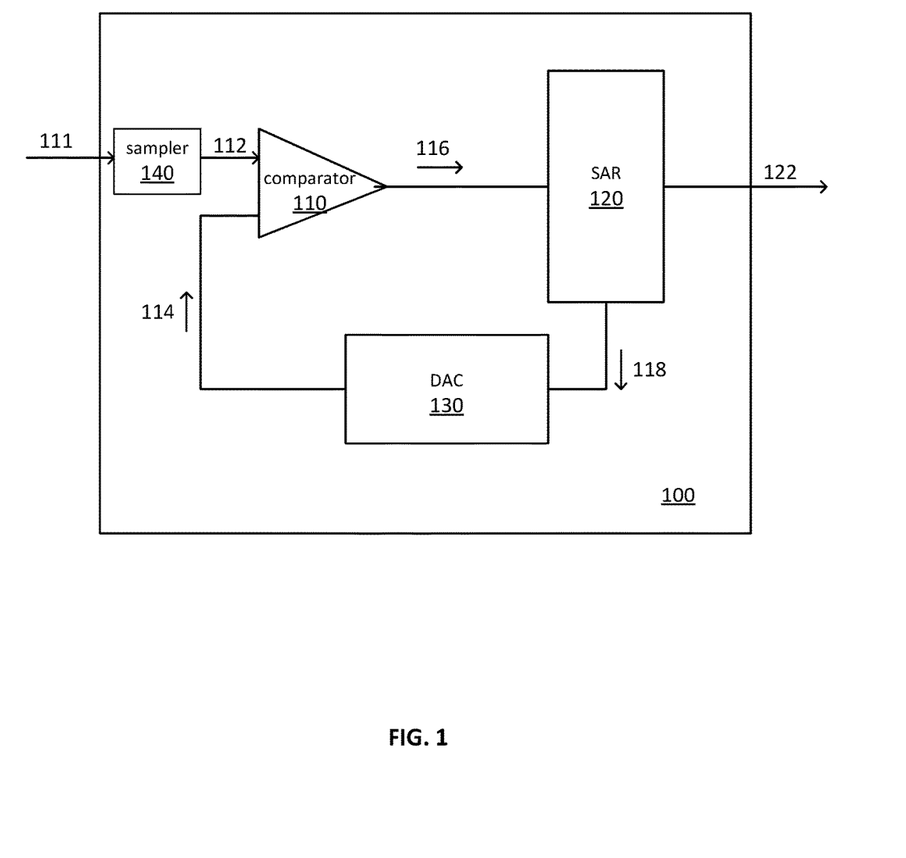
FIG. 1 is a block diagram illustrating a successive-approximation-register (SAR) analog-to-digital converter (ADC).

FIG. 1 illustrates a SAR ADC 100 that comprises an analog voltage comparator 110, a SAR 120, and a digital-to-analog converter (DAC) 130. During use, the SAR ADC 100 receives an analog input voltage 111, and a sampler 140 samples the analog input voltage 111 to provide a sampled voltage 112 to the comparator 110.

The analog voltage comparator 110 compares the sampled input voltage 112 to the output 114 (e.g., the approximation or threshold voltage) of the DAC 130, and outputs the binary comparison result 116 (e.g., the comparator's differential outputs) to the SAR 120. The SAR 120 receives the comparator's output 116 from the comparator 110 and stores binary values. The SAR 120 monitors the comparator's output 116 to see if a stored binary value is less than or greater than the input voltage 112, and adjusts the binary values accordingly. The SAR 120 provides this binary value 118 to the DAC 130, which in turns supplies the analog equivalent of this binary value (i.e., the output 114 of the DAC 130) to the comparator 110 for comparison with the sampled input voltage 112 in an approximation search. If the output 114 of the DAC 130 exceeds the sampled input voltage 112, the comparator 110 causes the SAR 120 to change the binary value 118. This binary search continues until every bit has been compared. At the end of the conversion, the SAR 120 provides a SAR output 122 that is the digital approximation of the input voltage for further digital processing.

The SAR ADC 100 also receives a clock signal from an external clock generator that controls the SAR ADC 100's conversion rate. Within each period of the global clock signal, the SAR ADC 100 has a sampling phase and a conversion phase. In the sampling phase, the SAR ADC 100 samples the analog input voltage 111 and provides a sampled voltage 112 to the comparator 110. In each conversion phase, the comparator 110 compares the sampled voltage 112 to the output 114 of the DAC 130, and provides the comparison result to the SAR 120. At the end of the conversion phase, the SAR 120 generates a corresponding digital SAR output 122 on a bit by bit basis to represent the input voltage 111 (e.g., an N-bit digital output) received by the SAR ADC 100.

In a conversion phase of the clock signal, N successive conversion cycles is needed for an N-bit SAR ADC. A control clock signal from a control clock generator may be utilized to initiate a conversion cycle for each bit. One approach to provide such a control clock uses synchronous clocking where a control clock generator is provided externally to drive the logics inside a SAR ADC with the control clock. However, distributing and buffering a high speed clock, especially in the case of ultra-high-speed time-interleaved SAR ADCs, make the synchronous clocking approach extremely power hungry. Another approach uses asynchronous clocking where the control clock signal is generated internally in an asynchronous fashion to drive the corresponding logics inside a SAR ADC. Since it does not require distribution and re-routing of the ultra-high-speed clock, asynchronous clocking is power efficient compared to synchronous clocking. Thus, it may be desirable to apply asynchronous clocking in ultra-high-speed time-interleaved ADCs.

Figure 21:
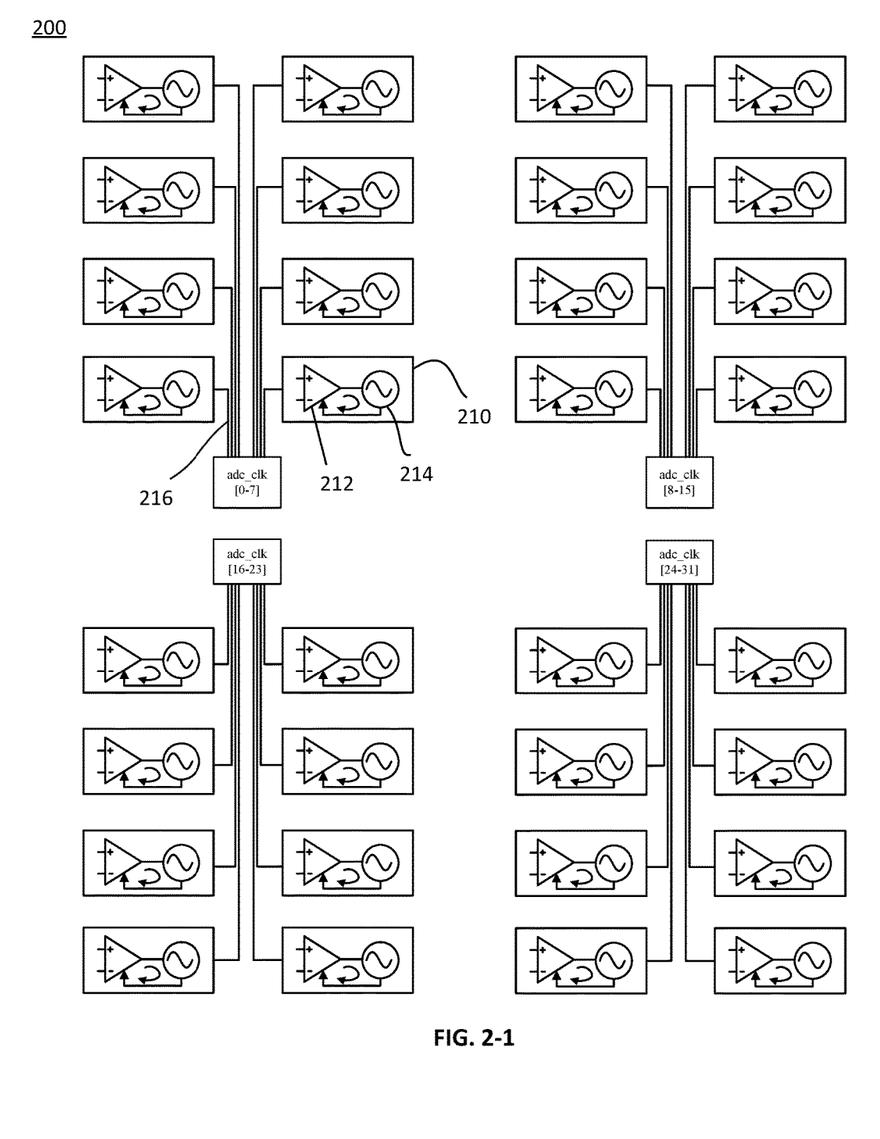

FIG. 2-1 illustrates a high-speed time-interleaved ADC architecture 200. The high-speed time-interleaved ADC architecture 200 incorporates 32 identical SAR ADCs 210.

In some cases, each SAR ADC may have the same or similar components shown in the SAR ADC 100 of FIG. 1. In particular, similar to the SAR ADC 100 of FIG. 1, each SAR ADC 210 comprises a comparator 212, a SAR and a DAC. It is noted that a SAR and DAC are not shown in a SAR DAC 210 in FIG. 2-1 for simplicity of illustration. In addition, detailed descriptions of these components similar to the components described in FIG. 1 are not repeated for the purpose of simplicity. With respect to clocking in the architecture 200, each of the SAR ADCs 210 is clocked by a corresponding global clock signal 216 (adc_clk[x] (x=0, . . . , 31)) so that each SAR ADC 210 takes turns to sample input signals. The global clock signal 216 may be provided by a multi-phase clock. In addition, a local asynchronous control clock generator 214 is provided inside each SAR ADC 210 to generate an asynchronous control clock signal to control initiation of a conversion cycle for each bit conversion in a conversion phase. Each asynchronous control clock signal is synced with a corresponding global clock that provides the global clock signal 216.

Although 32 SAR ADCs 210 are shown, in other examples, the ADC architecture 200 may have other numbers of SAR ADCs 210. For example, in other embodiments, the number of SAR ADCs 210 may be more than 32 or fewer than 32 (e.g., 16, 8, 4, 2, etc.). Also, in other embodiments, the SAR ADCs 210 in the ADC architecture 200 do not need to be identical. Instead, one or more of the SAR ADCs 210 may have a configuration that is different from other SAR ADCs 210 in the ADC architecture 200.

Figure 22:
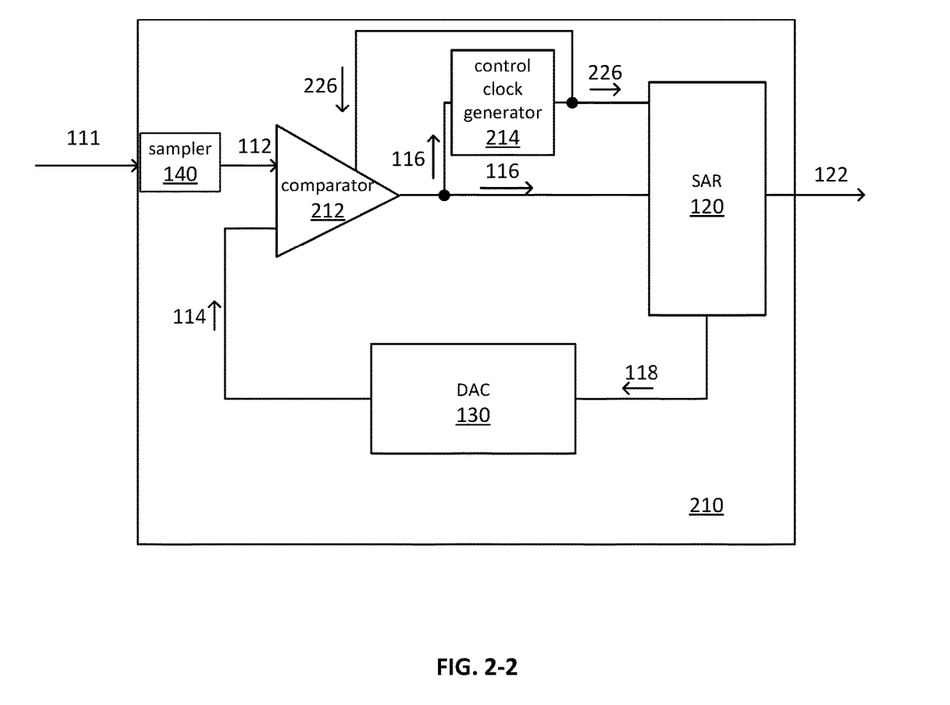

FIG. 2-2 illustrates an example of one of the SAR ADCs 210 in detail. The SAR ADC 210 comprises an analog voltage comparator 212, a local asynchronous control clock generator 214, a SAR 120 and a DAC 130. The control clock generator 214 is configured to provide clock signals for both the comparator 212 and the SAR 120. The control clock generator 214 is configured to generate a control clock signal 226 in response to at least the block clock signal 216 signal and the comparison output 116 received from the comparator 212. The control clock signal 226 from the control clock generator 214 is provided to (1) the SAR 120 to trigger the SAR 120 to store the comparator's output 116, and (2) the comparator 212 to initiate a new conversion cycle by making a comparison of the next bit to the output 114 (e.g., the approximation or threshold voltage) of the DAC 130.

When the global clock signal 216 is in a sampling phase, the SAR ADC 210 samples the analog input voltage 111 and provides a sampled voltage 112 to the comparator 212. When the global clock signal 216 enters a conversion phase, the analog voltage comparator 212 compares the sampled input voltage 112 to the output 114 (e.g., the approximation or threshold voltage) of the DAC 130, and outputs the binary comparison result 116 (e.g., the comparator's differential outputs) to the SAR 120. Upon completion of one conversion cycle, the control clock signal 226 initiates a next conversion cycle, and the comparator 212 makes a comparison for the next bit. The conversion cycle continues until the conversion phase of the global clock signal 216 ends.

Figure 4:
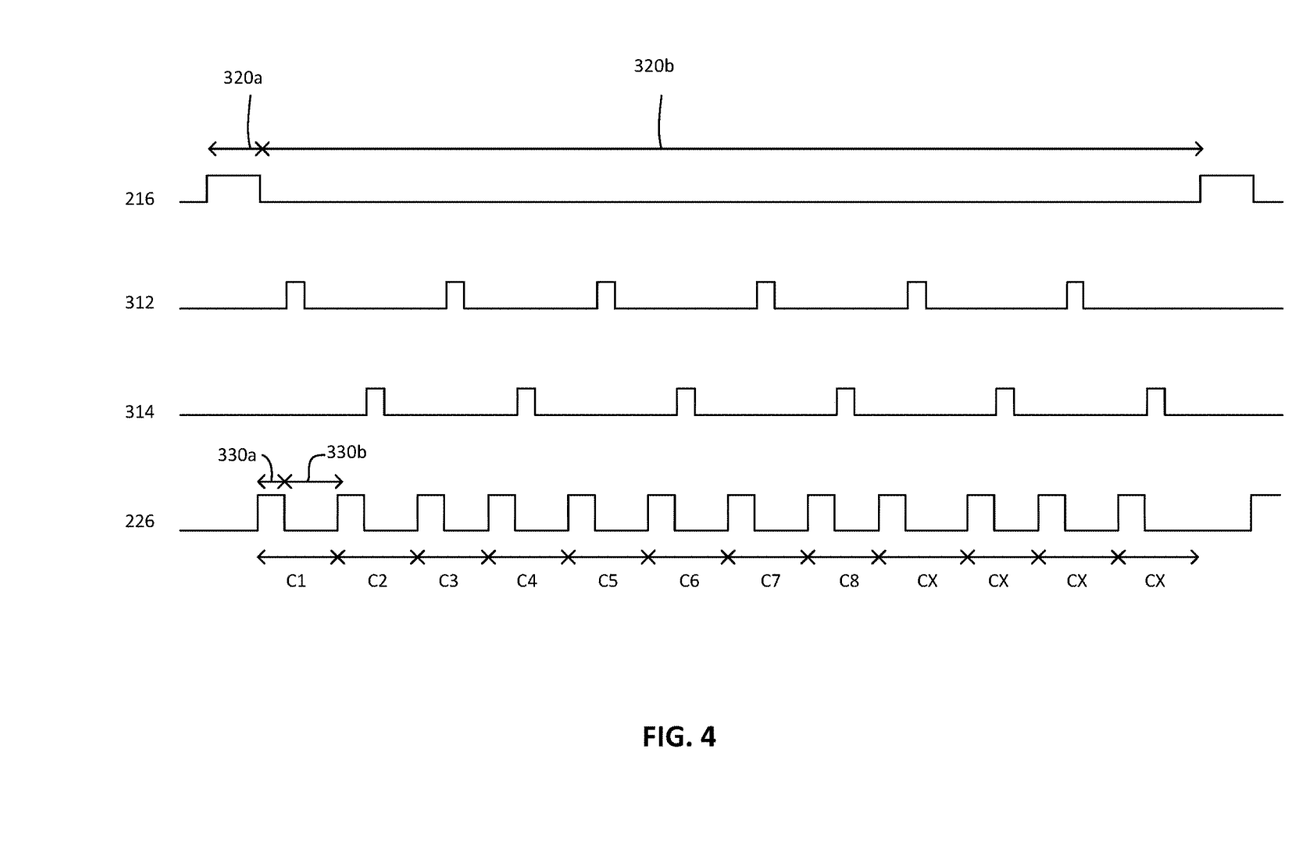
FIG. 4 is a timing diagram illustrating exemplary waveforms associated with the clock generator of FIG. 3.

FIG. 3-1 is a circuit diagram illustrating an example of an asynchronous control clock generator 300 that may be implemented as the asynchronous control clock generator 214 in each SAR ADC 210 in the architecture 200 of FIG. 2-1. FIG. 3-2 shows a SAR ADC having the asynchronous control clock generator 300 of FIG. 3-1. FIG. 4 is a timing diagram illustrating the waveforms associated with the asynchronous control clock generator 300.

Figure 31:
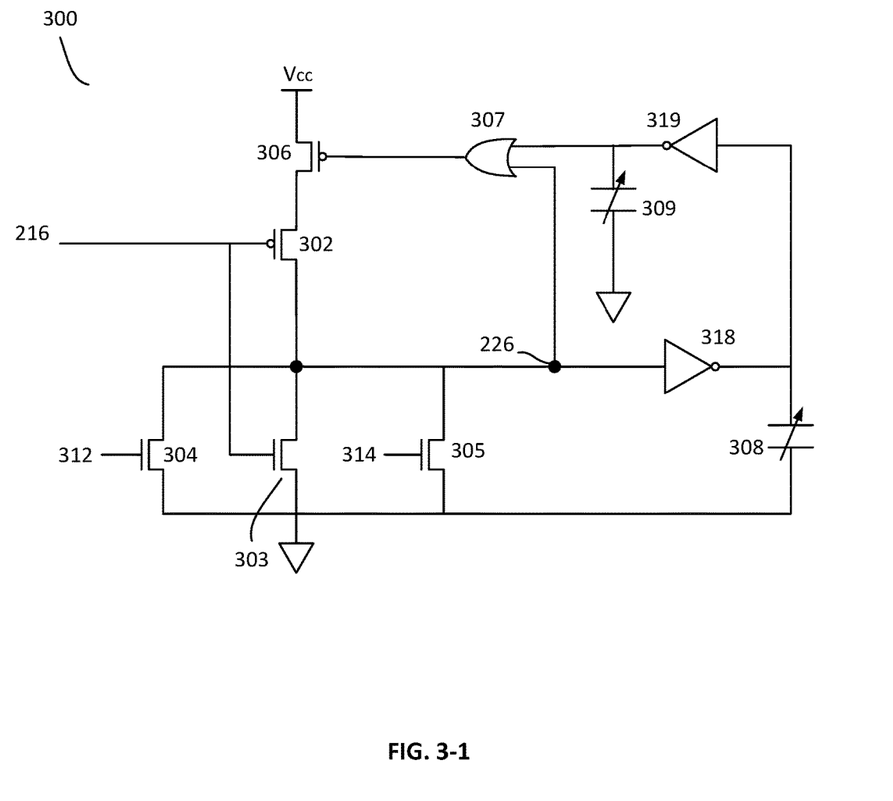
Figure 32:
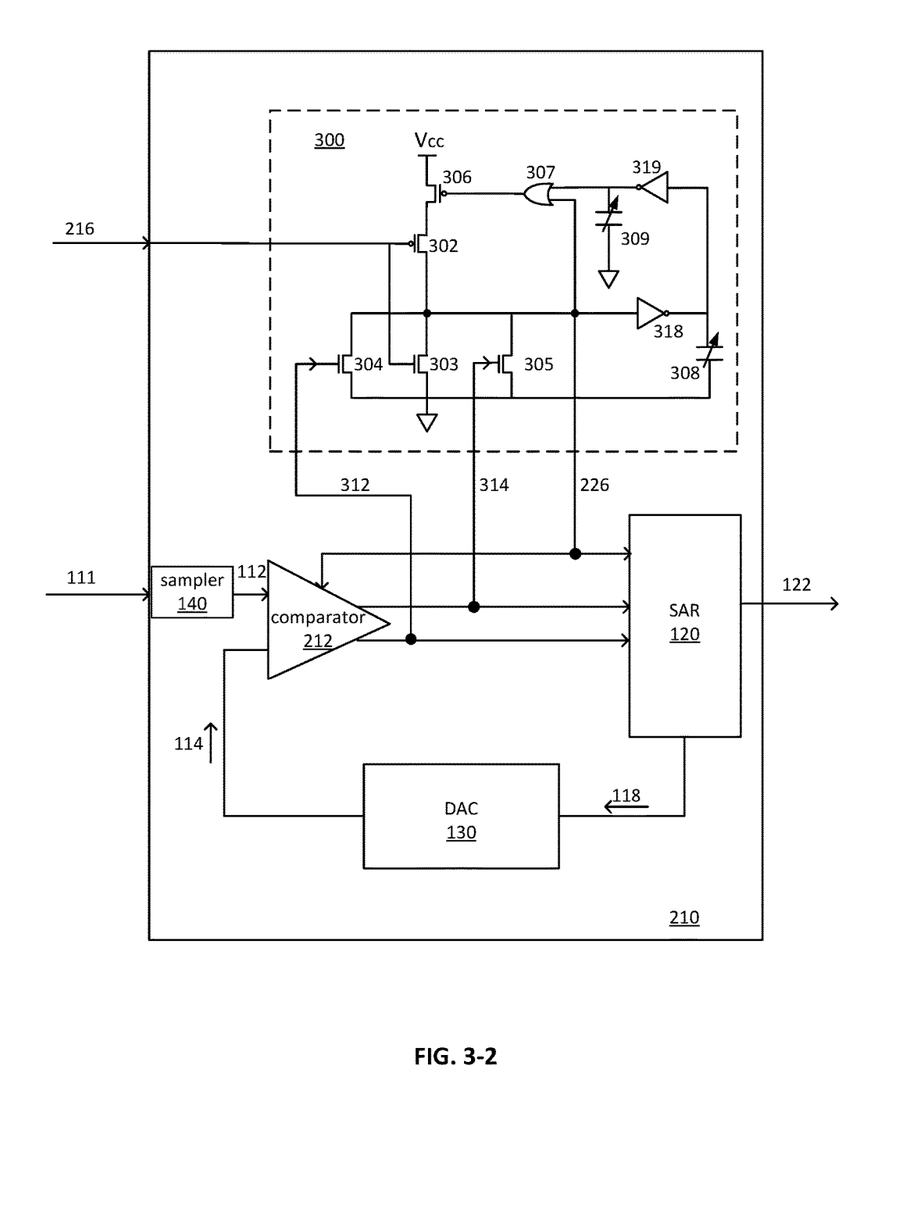

As shown in FIGS. 3-1 and 3-2, the asynchronous control clock generator 300 comprises a logic circuit configured to generate a control clock signal 226 that controls/initiates a conversion cycle. The logic circuit comprises a first transistor 302 (e.g., PMOS transistor) and a second transistor 303 (e.g., NMOS transistor) with its drain terminal coupled to the drain terminal of the first transistor 302. The gate terminal of the first transistor 302 and the gate terminal of the second transistor 303 are configured to receive a global clock signal 216 from a main clock generator external to the SAR ADC 210. The logic circuit of the asynchronous control clock generator 300 also comprises a third transistor 304 (e.g., NMOS transistor), and a fourth transistor 305 (e.g., NMOS transistor) coupled between the drain terminal of the first transistor 302 and ground. The gates of the third and fourth transistors 304, 305 are configured to receive the comparator's differential outputs 312, 314 respectively. In addition, the logic circuit of the asynchronous control clock generator 300 further comprises inverters 318, 319, switchable capacitors 308, 309, an OR gate 307 and a fifth transistor 306 (e.g., PMOS transistor). As shown in the figure, the fifth transistor 306 is coupled to the source of the first transistor 302, and the OR gate 307 coupled to the gate of the fifth transistor 306. The transistors 302, 303, 304, 305, 306 (where, for examples, transistors 302, 306 may be PMOS transistors, and transistors 303, 304, 305 may be NMOS transistors) in the asynchronous control clock generator 300 are configured to operate as switches. For a PMOS transistor, the transistor is turned on when the gate voltage of the transistor is low (e.g., below a threshold voltage), and the transistor is turned off when the gate voltage of the transistor is high (e.g., above a threshold voltage). For a NMOS transistor, the transistor is turned on when the gate voltage is high, and the transistor is turned off when the gate voltage is low. In addition, inverters 318, 319 and switchable capacitors 308 and 309 are configured to control the amount of delay before initiating a next conversion cycle.

Referring to FIGS. 3-2 and 4, the global clock signal 216 received at the first transistor 302 and the second transistor 303 controls the SAR ADC's 210 conversion rate. The SAR ADC 210 is in a sampling phase when the global clock signal 216 is at a high state. The SAR ADC 210 is in a conversion phase when the global clock signal 216 is at a low state. Specifically, when the global clock signal 216 is high (i.e., in a sampling phase), the first transistor 302 is off and second transistor 303 is on. The control clock signal 226 is connected to the ground when the second transistor 303 is turned on. Thus, the control clock signal 226 is low. When the global clock signal 216 turns from high to low (i.e., entering a conversion phase), the first transistor 302 is turned on and the second transistor 303 is turned off. The control clock signal 226 is connected to $V_{cc}$ through the first transistor 302 and the fifth transistor 306. Thus, the control clock signal 226 turns from low to high. The control clock signal 226 is provided to the comparator 212. The high state of the control clock signal 226 triggers the comparator 212 to make a comparison (i.e., initiate a conversion cycle). When the sampled signal 112 is greater than the output 114 from the DAC 130, the comparator differential output 312 turns to a high state. When the sampled signal 112 is less than the output 114 from the DAC 130, the comparator differential output 314 turns to a high state. Once one of the comparator differential outputs 312 and 314 turns from low to high, the corresponding transistor 304/405 is turned on. The control clock signal 226 is connected to ground through the transistor 304/305, and thus, the control clock signal 226 turns from high to low. After a certain delay (i.e., the control clock signal 226 passing through the two inverters 318, 319), the OR logic 307 outputs a low state and the fifth transistor 306 is turned on. As a result, the control clock signal 226 is connected to $V_{cc}$ though the first and fifth transistors 302, 306. A next conversion cycle is initiated in response to the assertion of the control clock signal 226.

With reference to FIG. 4, the global clock signal 216 generated from a main clock generator external to the SAR ADC 210 has a sampling phase 320a and a conversion phase 320b in each period. The SAR ADC 210 is in a sampling phase 320a sampling the input signal when the global clock signal 216 is at a high state. The SAR ADC 210 enters the conversion phase 320b when the global clock signal 216 turns from high to low. In each conversion phase 320b, there are multiple conversion cycles (e.g., 8 conversion cycles for a 8-bit SAR ADC) controlled by an asynchronous control clock signal 226 (shown in FIG. 4) that is generated by the asynchronous control clock generator 300.

As shown in FIG. 4, within each conversion cycle (e.g., C1), the SAR ADC 210 has a comparing phase 330a and a resetting phase 330b. In the comparing phase 330a (i.e., when the control clock signal 226 is in a high state), the comparator 212 of the SAR ADC 210 performs a comparison and provides comparator differential outputs 312 and 314 to the asynchronous control clock generator 300. Once one of the comparator differential outputs 312 and 314 turns high, the asynchronous control clock signal 226 is pulled down (because the control clock signal 226 connects to the ground through the NMOS logic 304/305) entering the resetting phase 330b. In the resetting phase 330b (i.e., when the control clock 226 is low), the comparator 212 is reset. After a certain delay controlled by the switchable capacitors 308, 309 and the two inverters 318 and 319 of FIG. 3-1, the asynchronous control clock signal 226 is pulled high to initiate a next conversion cycle. For an 8-bit SAR ADC, at least 8 successive cycles is needed to resolve all the bits.

The time for each conversion cycle (i.e., a period of the asynchronous control clock signal 226) may or may not be constant, and depends on the sampled input. When the sampled input voltage and the threshold voltage provided to the comparator 212 are close, the time for comparison may be longer. In this regards, the total time needed for conversion of all bits may be varying. Thus, the conversion phase 320b of the global clock signal 216 is usually left larger in order to allow the SAR ADC to resolve all the bits. As shown in FIG. 4, the asynchronous control clock signal 226 keeps operating (i.e., as cycles CXs) in the conversion phase 320b even after conversion of all the bits (e.g., 8 cycles in cycles C1-C8) is complete. Such an operation causes power consumption and may degrade power efficiency of the SAR ADC 210.

Comparators and asynchronous control clock generators consume more power when they switch at higher speed (e.g. 10 GHz or higher). The power consumption is more noticeable if there are multiple ADCs running. For example, a high speed time-interleaved ADC architecture 200 of FIG. 2-1 that incorporates 32 SAR ADCs has to employ 32 local asynchronous control clock generators. Thus, it may be desirable to reduce power consumption caused by the asynchronous control clock generators.

Figure 6:
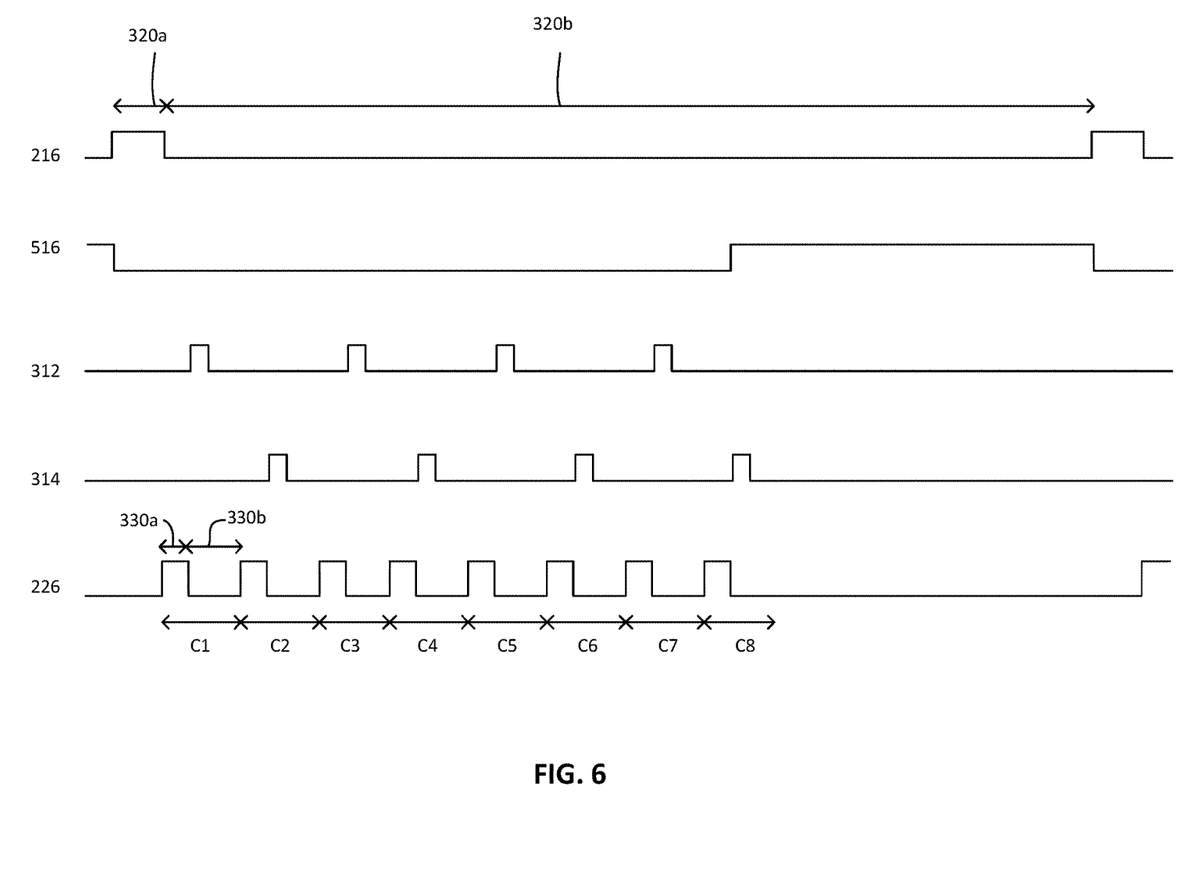
FIG. 6 is a timing diagram illustrating exemplary waveforms associated with the clock generator of FIG. 5.

FIG. 5-1 is a circuit diagram illustrating a clock generator 500. The clock generator 500 may be a power-efficient asynchronous control clock generator. Also, in some cases, the clock generator 500 may be implemented as the asynchronous control clock generator 214 in the architecture 200 of FIG. 2-1, and similarly in the SAR ADC in FIG. 2-2. FIG. 5-2 shows a SAR ADC having the clock generator 500 of FIG. 5-1. FIG. 6 is a timing diagram illustrating the waveforms associated with the asynchronous clock generator 500. It is noted that elements in FIG. 5-1 that are identical to elements in FIG. 3-1 have identical reference numbers, and therefore their description will not be repeated here. Similarly, elements in FIG. 5-2 that are identical to elements in FIG. 3-2 have identical reference numbers, and therefore their description will not be repeated here.

Figure 51:
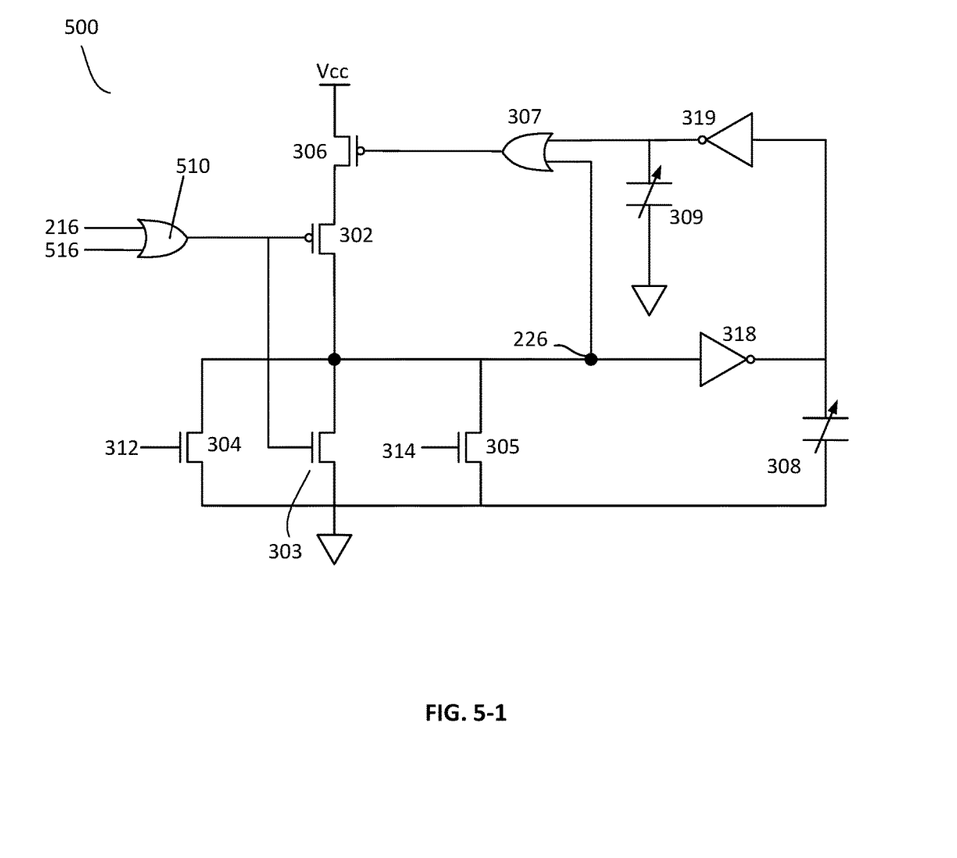
Figure 52:
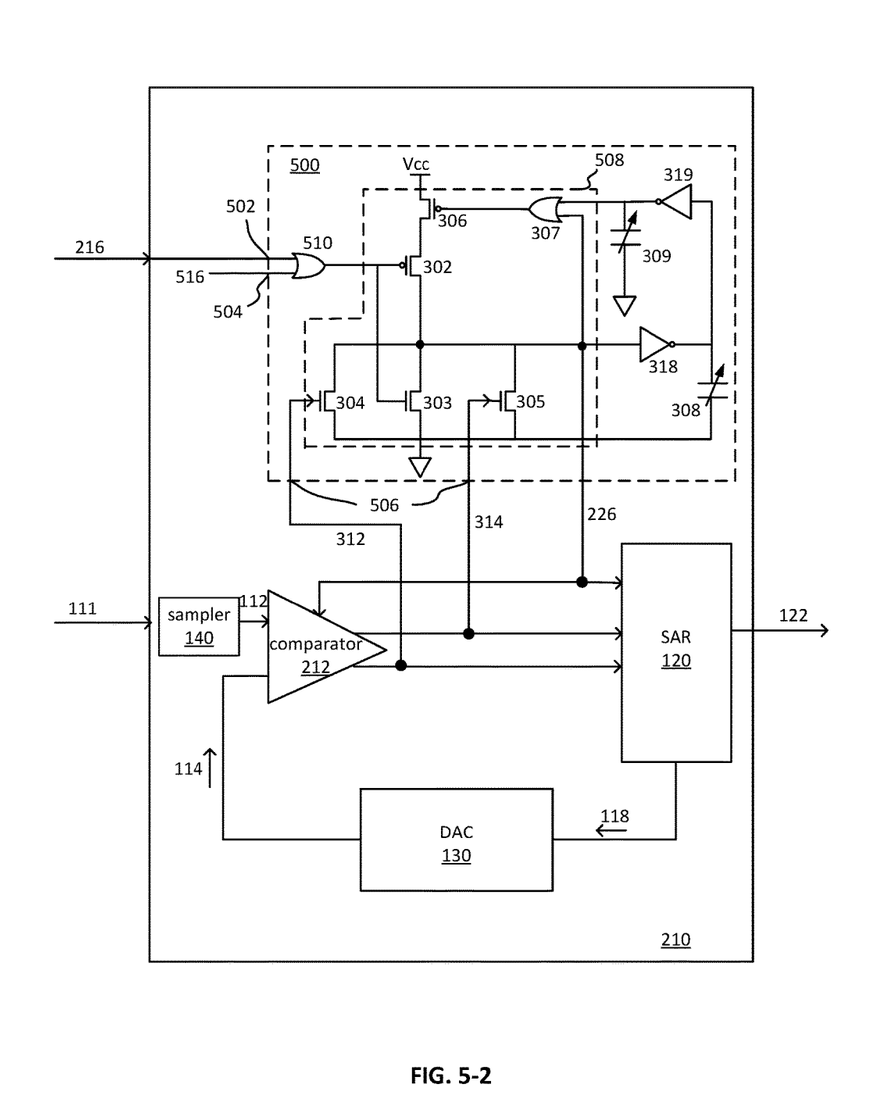

As shown in FIGS. 5-1 and 5-2, the clock generator 500 comprises a first input 502 for receiving a global clock signal 216, a second input 504 for receiving a completion signal 516, and a third input 506 for receiving differential outputs 312, 314 in a conversion cycle from a comparator 212. The clock generator 500 also includes a logic circuit 508 to generate a control clock signal 226. In addition to the elements in FIG. 3-1, the clock generator 500 further comprises an OR logic (OR gate) 510 to receive (1) a global clock signal 216 that controls the SAR ADC's conversion rate and (2) a completion signal 516. The global clock signal 216 is provided from a main clock generator external to the SAR ADC 210. The completion signal 516 is a signal indicating if conversion for all bits is complete. The completion signal 516 may be generated by using a shift register to track the bits that have been resolved. In another example, the completion signal 516 may be generated by using a latch output from the last bit to be resolved. Thus, in some embodiments, the SAR ADC may include one or more shift registers, and/or one or more latches, for tracking bits that have been resolved, or for indicating resolved bits. The one or more shift registers and/or one or more latches may be configured to provide the completion signal 516.

As similarly discussed with reference to FIGS. 3-1 and 3-2, the output of the OR logic 510 is provided to the gate terminals of the first transistor 302 and a second transistor 303. The drain terminal of the first transistor 302 is coupled to the drain terminal of the second transistor 303. The second transistor 303 is coupled between the first transistor 302 and ground. The clock generator 500 also comprises third and fourth transistors 304, 305 coupled between the drain terminal of the first transistor 302 and ground. The third and fourth transistors 304, 305 are configured to receive the comparator's differential outputs 312, 314 respectively. Similar to the asynchronous control clock generator 300, the clock generator 500 further comprise inverters 318, 319, variable capacitor 308, 309, an OR gate 307 and a fifth transistor 306.

Referring to FIGS. 5-2 and 6, during use, the clock generator 500 receives a global clock signal 216 and a completion signal 516. The global clock signal 216 is at a high state when the SAR ADC 210 is in a sampling phase 320a and at a low state when the SAR ADC 210 is in a conversion phase 320b. The completion signal 516 stays low until the conversion cycles for all the bits are complete. When all bits are resolved, the completion signal is set high. When the received global clock signal 216 is high (i.e., in the sampling phase 320a), the output of the OR logic 510 is always high regardless of the state of the completion signal 516. As a result, the first transistor 302 is off and the second transistor 303 is on. The control clock signal 226 is connected to the ground when the second transistor 303 turns on. When the received global clock signal 216 turns from high to low (entering a conversion phase 320b) and the completion signal 516 is low, the output of the OR logic 510 is low. Then the first transistor 302 is turned on and the second transistor 303 is turned off. The control clock signal 226 is connected to $V_{cc}$ through the PMOS logics 302 and

306. The control clock signal 226 is provided to the comparator 212. The high state of the control clock signal 226 triggers the comparator 212 to make a comparison (i.e., initiates a conversion cycle). When the sampled signal 112 is greater than the output 114 from the DAC 130, the differential output 312 turns to a high state. When the sampled signal 112 is less than the output 114 from the DAC 130, the differential output 314 turns to a high state. Once one of the comparator differential outputs 312 and 314 turns from low to high, the corresponding transistor 304/305 turns on. The control clock signal 226 is connected to ground, and thus, the control clock signal 226 turns from high to low. After a certain delay controlled by the two inverters 318, 319 and the switchable capacitors 308 and 309, the OR logic 307 outputs a low state and the fifth transistor 306 is turned on. As a result, the control clock signal 226 is connected to $V_{cc}$ though the first transistor 302 the fifth transistor 306. A next conversion cycle is initiated in response to the high state of the control clock signal 226. When the last bit is resolved (i.e., the comparator differential output 312/314 is turned from low to high for the last bit), the completion signal 516 is asserted. The output of the OR logic 510 is high. The first transistor 302 is off and second transistor 303 is on. Thus, the control clock signal 226 is connected to the ground through the second transistor 303, and is kept low. As a result, the clock generator 500 is disabled until the end of the conversion phase 320b. The comparator 212 also stops making comparison because there is no more control clock signal to trigger a conversion cycle.

As shown in the timing diagram of FIG. 6, when the conversion ends with resolving the last bit (i.e., cycle C8), the completion signal 516 is set high, and the OR logic 510 outputs a signal to disable the asynchronous clock generation. As a result, the asynchronous control clock signal 226 is not toggling anymore once the SAR conversion is completed successfully.

The introduction of a completion signal for shutting down the clock generator 500 does not trade off with the asynchronous clock performance, such as speed and jitter. In this regards, it is useful in high speed and low power clocking circuit for high speed ADCs. It should be noted that the embodiments of present disclosure are not limited to asynchronous clock generation for time-interleaving ADCs. It is also applicable to save power for high speed multi-core system with local asynchronous clocking.

Figure 7:
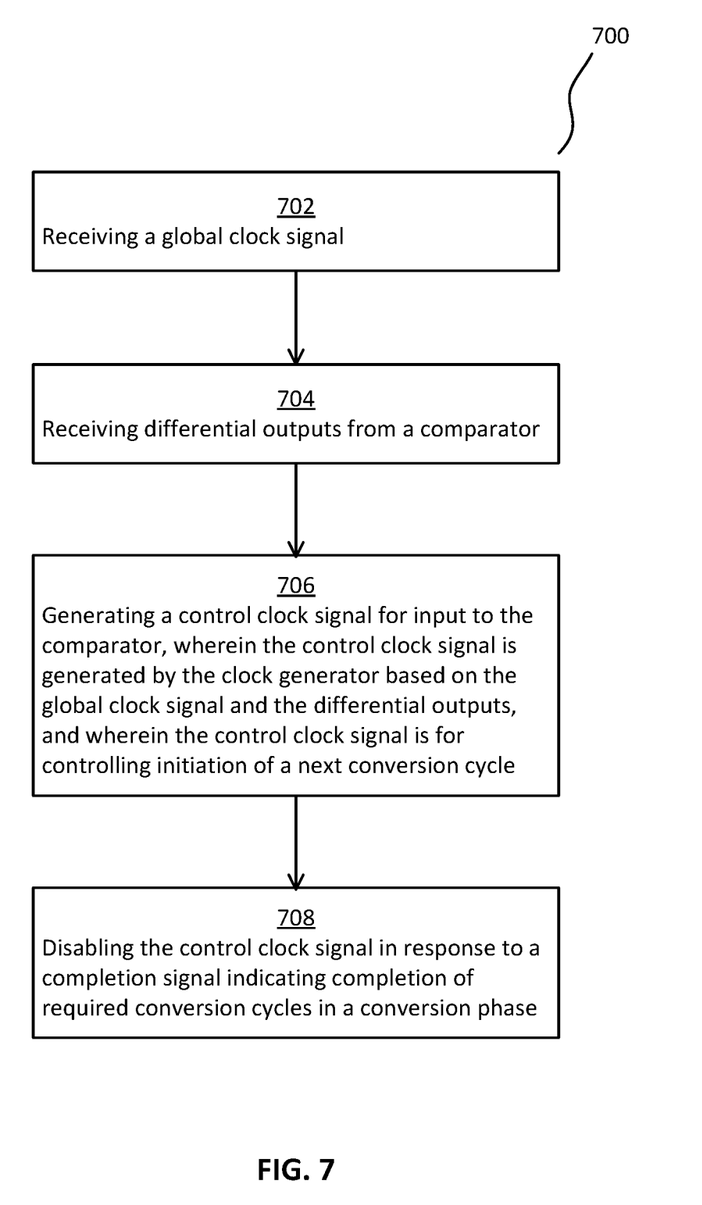
FIG. 7 illustrates a method performed by a clock generator.

FIG. 7 illustrates a method 700 performed by a clock generator. The method 700 includes receiving a global clock signal (item 702), and receiving differential outputs from a comparator (item 704). In some cases item 702 may be performed by a clock generator, such as the clock generator 500 described with reference to FIG. 5-2. Also, in some cases, the differential outputs may be the differential outputs 312, 314 provided from the comparator 212, and may be received by the clock generator 500 via the input 506.

Returning to FIG. 7, the method 700 also includes generating a control clock signal for input to the comparator (item 706). In some embodiments, the control clock signal is generated by the clock generator 500 of FIG. 5-2 based on the global clock signal 216 and the differential outputs 312, 314, wherein the control clock signal is for controlling initiation of a next conversion cycle. Also, in some cases, item 706 may be performed by the logic circuit 508 discussed with reference to FIGS. 5-1 and 5-2.

Returning to FIG. 7, the method 700 also includes disabling the control clock signal in response to a completion signal indicating completion of required conversion cycles in a conversion phase (item 708). In some embodiments, the completion signal may be the completion signal 516 described with reference to FIGS. 5-1 and 5-2. The completion signal is for indicating if conversion for all bits is complete. The completion signal may be generated by using a shift register to track the bits that have been resolved. In another example, the completion signal may be generated by using a latch output from the last bit to be resolved. Thus, in some embodiments, the method may include providing one or more shift registers, and/or one or more latches, for tracking bits that have been resolved, or for indicating resolved bits. The one or more shift registers and/or one or more latches may be configured to provide the completion signal.

In some cases, the method 700 may further includes: triggering a sampling of an input signal based on a first edge of the global clock signal; and triggering a conversion of the sampled input signal to a corresponding digital output signal on a bit-by-bit basis based on a second edge of the global clock signal. In addition, in some cases, the method 700 may further include: triggering a comparison by the comparator based on a first edge of the control clock signal; and triggering a resetting of the comparator based on a second edge of the control clock signal. In some cases, the high state of the control clock signal may be employed to trigger the comparator to make a comparison (i.e., initiates a conversion cycle). Techniques of triggering the sampling, triggering the comparison, and triggering a resetting of a comparator are described above with reference to FIGS. 3-2, 4, 5-1, 5-2, and 6, and will not be repeated here.

Also, in some embodiments, in method 700, the clock generator may be an asynchronous clock generator, which performs the acts of receiving the global clock signal and the differential outputs, the act of generating the control clock signal, and the act of disabling the control clock signal.

Embodiments of the present disclosure provide a power efficient asynchronous clock generator for ultra-high-speed SAR ADCs. A method for reducing power consumption of asynchronous control clock generators is provided by shutting down the local control clock automatically when the conversion is complete. When the local asynchronous control clock is disabled, it would not initiate a next comparison and thus stopping the comparator from making another comparison. It some cases, with the above technique, at least 10%, and more preferably at least 15%, and even more preferably at least 20% or higher, such as approximately 25% (e.g., 25%±3%), of power may be saved using architecture described in connection with FIG. 5-1.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. A clock generator, comprising:
a first input to receive a global clock signal;
a second input to receive a completion signal;
a third input to receive differential outputs in a conversion cycle from a comparator; and
a logic circuit configured to generate a control clock signal based at least in part on the global clock signal and the differential outputs, and to provide the control clock signal to the comparator for a next conversion cycle;

wherein the logic circuit is also configured to disable the control clock signal in response to the completion signal indicating a completion of required conversion cycles in a conversion phase, and enable the control clock signal in response to the global clock signal indicating a sampling phase.

2. The clock generator of claim 1, wherein the clock generator is an asynchronous clock generator forming a part of, or coupling to, a successive-approximation-register analog-to-digital convertor (SAR ADC).

3. The clock generator of claim 2, wherein the global clock signal is for controlling a conversion rate of the SAR ADC, wherein a first edge of the global clock signal is configured to trigger a sampling of an input signal, and a second edge of the global clock signal is configured to trigger a conversion of the sampled input signal to a corresponding digital output signal on a bit-by-bit basis.

4. The clock generator of claim 1, wherein a first edge of the control clock signal is configured to trigger a comparison by the comparator and a second edge of the control clock signal is configured to trigger a resetting of the comparator.

5. The clock generator of claim 1, further comprising an OR gate, wherein the first input and the second input are inputs of the OR gate.

6. A successive-approximation-register analog-to-digital convertor (SAR ADC) comprising the clock generator of claim 1.

7. The clock generator of claim 1, wherein the logic circuit comprises:
a first transistor;
a second transistor, wherein a drain of the first transistor is coupled to a drain of the second transistor;
a third transistor configured to receive a first output of the differential outputs; and
a fourth transistor configured to receive a second output of the differential outputs;
wherein the third transistor and the fourth transistor are coupled between the first transistor and ground.

8. The clock generator of claim 7, wherein the logic circuit further comprises a fifth transistor coupled to a source of the first transistor, and an OR gate coupled to a gate of the fifth transistor.

9. A method performed by a clock generator, comprising:
receiving a global clock signal;
receiving differential outputs from a comparator;
generating a control clock signal for input to the comparator, wherein the control clock signal is generated by the clock generator based on the global clock signal and the differential outputs, and wherein the control clock signal is for controlling initiation of a next conversion cycle;
disabling the control clock signal in response to a completion signal indicating completion of required conversion cycles in a conversion phase; and
enabling the control clock signal in response to the global clock signal indicating a sampling phase.

10. The method of claim 9, further comprising:
triggering a sampling of an input signal based on a first edge of the global clock signal; and
triggering a conversion of the sampled input signal to a corresponding digital output signal on a bit-by-bit basis based on a second edge of the global clock signal.

11. The method of claim 9, wherein the clock generator is an asynchronous clock generator, which performs the acts of receiving the global clock signal and the differential outputs, the act of generating the control clock signal, and the act of disabling the control clock signal.

12. The method of claim 9, further comprising:
triggering a comparison by the comparator based on a first edge of the control clock signal; and
triggering a resetting of the comparator based on a second edge of the control clock signal.

13. An analog-to-digital convertor (ADC), comprising:
a comparator configured to provide differential outputs in a conversion cycle;
a successive-approximation-register (SAR) configured to receive the differential outputs from the comparator, and to provide a N-bit binary output; and
a clock generator having an input to receive the differential outputs from the comparator, the clock generator configured to generate a control clock signal for initiation of a next conversion cycle, wherein the clock generator is configured to disable the control clock signal in response to a completion signal indicating completion of N conversion cycles in a conversion phase, and enable the control clock signal in response to the global clock signal indicating a sampling phase.

14. The ADC of claim 13, further comprising a clock input to receive a global clock signal, wherein the global clock signal is configured for controlling a conversion rate of the ADC.

15. The ADC of claim 14, wherein a first edge of the global clock signal is configured to trigger a sampling of an input signal, and a second edge of the global clock signal is configured to trigger a conversion of the sampled input signal to a corresponding digital output signal on a bit-by-bit basis.

16. The ADC of claim 14, wherein the clock generator is configured to generate the control clock signal based on the global clock signal and the differential outputs from the comparator.

17. The ADC of claim 14, wherein the clock generator comprises an OR gate with a first input to receive the global clock signal and a second input to receive the completion signal.

18. The ADC of claim 13, wherein the control clock signal generated by the clock generator is an asynchronous clock signal.

19. The ADC of claim 13, wherein a first edge of the control clock signal is configured to trigger a comparison by the comparator, and a second edge of the control clock signal is configured to trigger a resetting of the comparator.

20. A time-interleaved SAR ADC architecture comprising the ADC of claim 11 and additional ADCs, wherein the ADC is time-interleaving with the additional ADCs.

* * * * *